United States Patent
Harel

(10) Patent No.: US 10,418,948 B2
(45) Date of Patent: Sep. 17, 2019

(54) OPTIMIZING POWER EFFICIENCY OF A POWER AMPLIFIER CIRCUIT TO REDUCE POWER CONSUMPTION IN A REMOTE UNIT IN A WIRELESS DISTRIBUTION SYSTEM (WDS)

(71) Applicant: Corning Optical Communications LLC, Hickory, NC (US)

(72) Inventor: Dror Harel, Hod Hasharon (IL)

(73) Assignee: Corning Optical Communications LLC, Hickory, NC (US)

(*) Notice: Subject to any disclaimer, the term of this patent is extended or adjusted under 35 U.S.C. 154(b) by 139 days.

(21) Appl. No.: 15/599,613

(22) Filed: May 19, 2017

(65) Prior Publication Data
US 2018/0337640 A1    Nov. 22, 2018

(51) Int. Cl.
*H03F 1/30* (2006.01)
*H03D 7/16* (2006.01)
(Continued)

(52) U.S. Cl.
CPC ............. *H03F 1/30* (2013.01); *H03D 7/16* (2013.01); *H03F 1/0222* (2013.01); *H03F 3/189* (2013.01); *H03F 3/211* (2013.01); *H03F 3/217* (2013.01); *H03F 3/2178* (2013.01); *H03F 3/24* (2013.01); *H03F 3/45475* (2013.01); *H03F 3/68* (2013.01); *H04B 17/13* (2015.01); *H05K 1/0227* (2013.01); *H03D 2200/009* (2013.01);
(Continued)

(58) Field of Classification Search
CPC .......... H03F 1/30; H03F 1/0222; H03F 3/189; H03F 3/211; H03F 3/217; H03F 3/2178; H03F 3/24; H03F 3/45475; H03F 3/68; H03F 2200/114; H03F 2200/451; H03F 2203/21192; H03D 7/16; H03D 2200/009; H05K 1/0227; H04B 17/13
USPC ............................................. 455/127.1–127.4
See application file for complete search history.

(56) References Cited

U.S. PATENT DOCUMENTS 5,974,041 A * 10/1999 Kornfeld ............... H03F 1/0277
                                                          370/342
2014/0120854 A1   5/2014 Briffa et al.

FOREIGN PATENT DOCUMENTS

EP          2408160 A1     1/2012

OTHER PUBLICATIONS

International Search Report and Written Opinion PCT/IL2018/050519 dated Aug. 17, 2018.

* cited by examiner

*Primary Examiner* — Lee Nguyen
(74) *Attorney, Agent, or Firm* — C. Keith Montgomery

(57) ABSTRACT

Embodiments of the disclosure relate to optimizing power efficiency of a power amplifier circuit to reduce power consumption in a remote unit in a wireless distribution system (WDS). A power amplifier circuit is provided in the remote unit to amplify a received input signal associated with a signal channel(s) to generate an output signal at an aggregated peak power. In this regard, a control circuit is configured to analyze at least one physical property related to the signal channel(s) to determine a maximum output power of the power amplifier circuit. Accordingly, the control circuit configures the power amplifier circuit according to the determined maximum output power. By configuring the maximum output power based on the signal channel(s) in the input signal, it may be possible to optimize the power efficiency of the power amplifier circuit, thus helping to reduce the power consumption of the remote unit.

24 Claims, 9 Drawing Sheets

(51) Int. Cl.
*H03F 3/45* (2006.01)
*H05K 1/02* (2006.01)
*H03F 1/02* (2006.01)
*H03F 3/189* (2006.01)
*H03F 3/21* (2006.01)
*H03F 3/217* (2006.01)
*H03F 3/24* (2006.01)
*H03F 3/68* (2006.01)
*H04B 17/13* (2015.01)

(52) U.S. Cl.
CPC .. *H03F 2200/114* (2013.01); *H03F 2200/451* (2013.01); *H03F 2203/21193* (2013.01)

OPTIMIZING POWER EFFICIENCY OF A POWER AMPLIFIER CIRCUIT TO REDUCE POWER CONSUMPTION IN A REMOTE UNIT IN A WIRELESS DISTRIBUTION SYSTEM (WDS)

BACKGROUND

The disclosure relates generally to reducing radio frequency (RF) interference in a wireless distribution system (WDS), such as a distributed antenna system (DAS), and more particularly to reducing RF interference in uplink RF communications signals in a remote unit in a WDS.

Wireless customers are increasingly demanding digital data services, such as streaming video signals. At the same time, some wireless customers use their wireless communications devices in areas that are poorly serviced by conventional cellular networks, such as inside certain buildings or areas where there is little cellular coverage. One response to the intersection of these two concerns has been the use of DASs. DASs include remote units configured to receive and transmit communications signals to client devices within an antenna range of the remote units. DASs can be particularly useful when deployed inside buildings or other indoor environments where the wireless communications devices may not otherwise be able to effectively receive RF signals from a source.

In this regard, FIG. 1 illustrates a distribution of communications services to remote coverage areas 100(1)-100(N) of a WDS provided in the form of a DAS 102, wherein 'N' is the number of remote coverage areas. These communications services can include cellular services, wireless services, such RF identification (RFID) tracking, Wireless Fidelity (Wi-Fi), local area network (LAN), and wireless LAN (WLAN), wireless solutions (Bluetooth, Wi-Fi Global Positioning System (GPS), signal-based, and others) for location-based services, and combinations thereof, as examples. The remote coverage areas 100(1)-100(N) may be remotely located. In this regard, the remote coverage areas 100(1)-100(N) are created by and centered on remote units 104(1)-104(N) connected to a central unit 106 (e.g., a head-end equipment, a head-end controller, or a head-end unit). The central unit 106 may be communicatively coupled to a signal source 108, for example a base transceiver station (BTS) or a baseband unit (BBU). In this regard, the central unit 106 receives downlink communications signals 110D from the signal source 108 to be distributed to the remote units 104(1)-104(N). The remote units 104(1)-104(N) are configured to receive the downlink communications signals 110D from the central unit 106 over a communications medium 112 to be distributed to the respective remote coverage areas 100(1)-100(N) of the remote units 104(1)-104(N). Each of the remote units 104(1)-104(N) may include an RF transmitter/receiver and a respective antenna 114(1)-114(N) operably connected to the RF transmitter/receiver to wirelessly distribute the communications services to client devices 116 within the respective remote coverage areas 100(1)-100(N). The remote units 104(1)-104(N) are also configured to receive uplink communications signals 110U from the client devices 116 in the respective remote coverage areas 100(1)-100(N) to be distributed to the signal source 108. The size of each of the remote coverage areas 100(1)-100(N) is determined by the amount of RF power transmitted by the respective remote units 104(1)-104(N), receiver sensitivity, antenna gain, and RF environment, as well as by RF transmitter/receiver sensitivity of the client devices 116. The client devices 116 usually have a fixed maximum RF receiver sensitivity, so that the above-mentioned properties of the remote units 104(1)-104(N) mainly determine the size of the respective remote coverage areas 100(1)-100(N).

To provide adequate RF coverage in the remote coverage areas 100(1)-100(N), each of the remote units 104(1)-104(N) may include one or more power amplifiers to amplify the downlink communications signals 110D prior to transmitting to the client devices 116. Notably, the power amplifier(s) may consume a large amount of power when amplifying the downlink communications signals 110D to a desired power level. More specifically, power consumption of the power amplifier(s) is dictated by the maximum output power of the power amplifier(s). In other words, the power amplifier(s) would consume the same amount of power regardless of whether the power amplifier(s) is outputting the maximum power or the minimum power. As such, it may be desired to optimize configuration and operation of the power amplifier(s) to help reduce power consumption of the remote units 104(1)-104(N).

No admission is made that any reference cited herein constitutes prior art. Applicant expressly reserves the right to challenge the accuracy and pertinency of any cited documents.

SUMMARY

Embodiments of the disclosure relate to optimizing power efficiency of a power amplifier circuit to reduce power consumption in a remote unit in a wireless distribution system (WDS). A power amplifier circuit is provided in the remote unit to amplify a received input signal associated with one or more signal channels to generate an output signal at an aggregated peak power. Notably, the more signal channels the input signal includes, the higher the aggregated peak power of the output signal will be. Accordingly, the higher a maximum output power the power amplifier circuit is configured to provide, the more power the power amplifier circuit would consume. In this regard, a control circuit is configured to analyze at least one physical property related to the signal channel(s) to determine the maximum output power of the power amplifier circuit. Accordingly, the control circuit configures the power amplifier circuit according to the determined maximum output power. By configuring the power amplifier circuit according to the maximum output power determined based on the signal channel(s) in the input signal, it may be possible to optimize the power efficiency of the power amplifier circuit, thus helping to reduce the power consumption of the remote unit.

In this regard, in one aspect, a power management circuit is provided. The power management circuit includes a power amplifier circuit including a signal input and a signal output. The power amplifier circuit is configured to receive an input signal comprising one or more signal channels via the signal input. The power amplifier circuit is also configured to amplify the received input signal to generate an output signal at an aggregated peak power. The power amplifier circuit is also configured to provide the output signal to the signal output. The power management circuit also includes a control circuit. The control circuit is configured to analyze at least one physical property related to the one or more signal channels of the input signal. The control circuit is also configured to determine a maximum output power for the power amplifier circuit to amplify the received input signal to the aggregated peak power based on the at least one physical property of the one or more signal channels. The maximum output power is greater than or equal to the aggregated peak power of the output signal. The control circuit is also configured to configure the power amplifier circuit according to the determined maximum output power.

In another aspect, a method for configuring a power amplifier circuit in a remote unit in a WDS is provided. The method includes receiving an input signal comprising one or more signal channels. The method also includes analyzing at least one physical property related to the one or more signal channels of the input signal. The method also includes determining a maximum output power for a power amplifier circuit to amplify the received input signal to an aggregated peak power based on the at least one physical property of the one or more signal channels. The maximum output power is greater than or equal to the aggregated peak power. The method also includes configuring the power amplifier circuit according to the determined maximum output power. The method also includes amplifying the received input signal to generate an output signal at the aggregated peak power.

In another aspect, a WDS is provided. The WDS includes a plurality of remote units. The plurality of remote units is configured to receive and convert a plurality of downlink communications signals into a plurality of downlink radio frequency (RF) communications signals for distribution to client devices. The plurality of remote units is also configured to receive a plurality of uplink RF communications signals from the client devices and convert the plurality of uplink RF communications signals into a plurality of uplink communications signals. The WDS also includes a central unit. The central unit is configured to distribute the plurality of downlink communications signals to the plurality of remote units. The central unit is also configured to receive the plurality of uplink communications signals from the plurality of remote units. At least one selected remote unit among the plurality of remote units includes a power management circuit. The power management circuit includes a power amplifier circuit comprising a signal input and a signal output. The power amplifier circuit is configured to receive an input signal among the plurality of downlink RF communications signals. The input signal includes one or more signal channels via the signal input. The power amplifier circuit is also configured to amplify the received input signal to generate an output signal at an aggregated peak power. The power amplifier circuit is also configured to provide the output signal to the signal output for distribution among the plurality of downlink RF communications signals to the client devices. The power management circuit also includes a control circuit. The control circuit is configured to analyze at least one physical property related to the one or more signal channels of the input signal. The control circuit is also configured to determine a maximum output power for the power amplifier circuit to amplify the received input signal to the aggregated peak power based on the at least one physical property of the one or more signal channels. The maximum output power is greater than or equal to the aggregated peak power of the output signal. The control circuit is also configured to configure the power amplifier circuit according to the determined maximum output power.

Additional features and advantages will be set forth in the detailed description which follows and, in part, will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding of the disclosure, and are incorporated in and constitute a part of this specification. The drawings illustrate one or more embodiments, and together with the description serve to explain principles and operation of the various embodiments.

DETAILED DESCRIPTION

Figure 1:
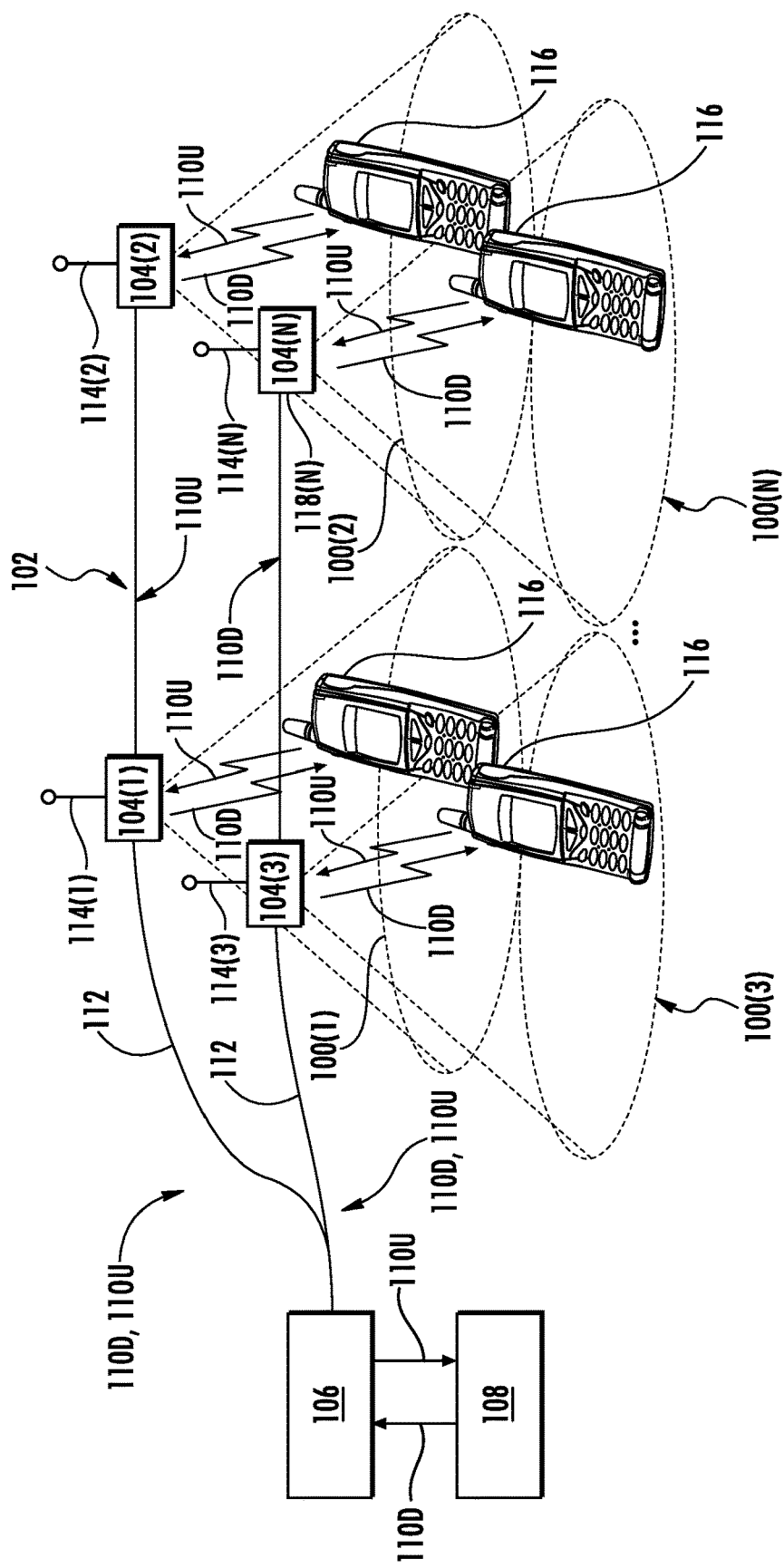
FIG. 1 is a schematic diagram of an exemplary wireless distribution system (WDS), which may be a distributed antenna system (DAS) for example.

Embodiments of the disclosure relate to optimizing power efficiency of a power amplifier circuit to reduce power consumption in a remote unit in a wireless distribution system (WDS). A power amplifier circuit is provided in the remote unit to amplify a received input signal associated with one or more signal channels to generate an output signal at an aggregated peak power. Notably, the more signal channels the input signal includes, the higher the aggregated peak power of the output signal will be. Accordingly, the higher a maximum output power the power amplifier circuit is configured to provide, the more power the power amplifier circuit would consume. In this regard, a control circuit is configured to analyze at least one physical property related to the signal channel(s) to determine the maximum output power of the power amplifier circuit. Accordingly, the control circuit configures the power amplifier circuit according to the determined maximum output power. By configuring the power amplifier circuit according to the maximum output power determined based on the signal channel(s) in the input signal, it may be possible to optimize the power efficiency of the power amplifier circuit, thus helping to reduce the power consumption of the remote unit.

In a WDS, a remote unit may be configured to support multiple service operators and/or communicate radio frequency (RF) communications signals in multiple signal channels. The actual number of signal channels to be supported by a remote unit may not be known in advance and may change dynamically based on service and capacity needs. Since the actual number of signal channels to be amplified by one or more power amplifiers in the remote unit is not known in advance, the power amplifier(s) may be configured based on an estimated maximum number of signal channels. In addition, the maximum output power of the power amplifier(s) may be so determined to support worst-case aggregated peak powers of the estimated maximum number of signal channels. Since the power amplifier(s) may be a class A or class A/B power amplifier(s), power level of input signals may have very little impact on actual power consumption of the power amplifier(s). In other words, the power amplifier(s) may consume almost the same amount of power regardless of whether the power amplifier(s) is generating the maximum output power or any aggregated output power less than the maximum output power. Hence, it may be necessary to reconfigure the maximum output power of the power amplifier(s) (e.g., dynamically) to help optimize power efficiency and reduce power consumption of the power amplifier(s). As discussed in the exemplary aspects below, it may be possible to determine the maximum output power of the power amplifier(s) based on physical properties of the signal channels and configured the power amplifier(s) accordingly. By configuring the power amplifier(s) according to the maximum output power of the power amplifier(s) determined based on the physical properties of the signal channel(s), it may be possible to optimize power efficiency of the power amplifier circuit, thus helping to reduce power consumption of the remote unit.

Figure 2A:
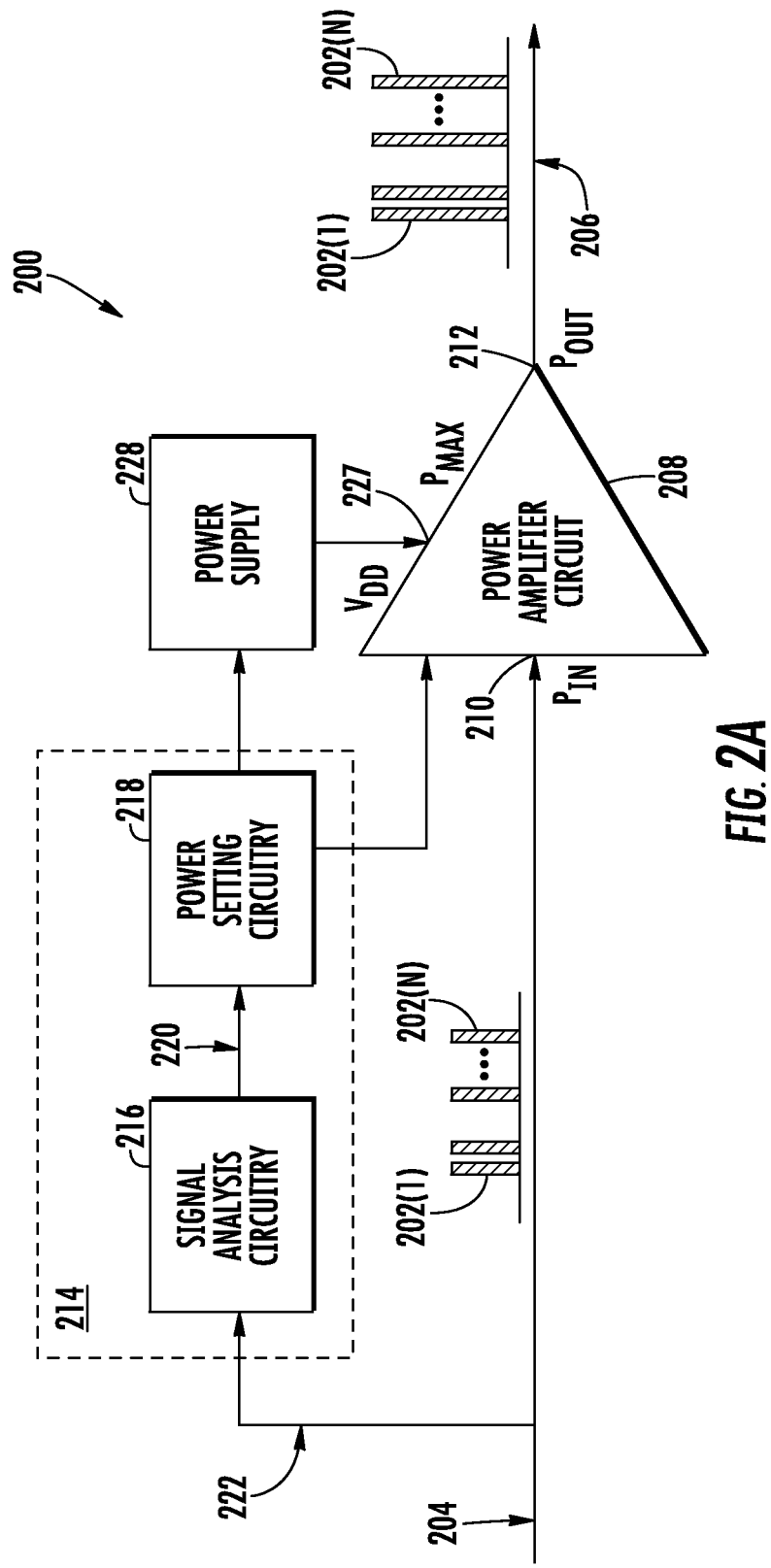
FIG. 2A is a schematic diagram of an exemplary power management circuit configured to analyze at least one physical property of one or more signal channels associated with an input signal to determine a maximum output power of an output signal by analyzing the input signal.

In this regard, FIG. 2A is a schematic diagram of an exemplary power management circuit 200 configured to analyze at least one physical property of one or more signal channels 202(1)-202(N) associated with an input signal 204 to determine an maximum output power $P_{MAX}$ of an output signal 206 by analyzing the input signal 204. The power management circuit 200 includes a power amplifier circuit 208 that includes a signal input 210 and a signal output 212. The power amplifier circuit 208 is configured to receive the input signal 204 at an input power $P_{IN}$ via the signal input 210. The power amplifier circuit 208 is further configured to amplify the input signal 204 to generate the output signal 206 at an aggregated peak power $P_{OUT}$ ($P_{OUT} \geq P_{IN}$) and provide the output signal 206 to the signal output 212. In a non-limiting example, the input signal 204 and the output signal 206 can be time-varying signals (e.g., sinusoidal signals) with time-varying amplitudes. As such, the aggregated peak power $P_{OUT}$ corresponds to a peak amplitude of the output signal 206. The output signal 206 can include the signal channels 202(1)-202(N) as well.

The power management circuit 200 includes a control circuit 214, which can be microprocessor, a microcontroller, or a field-programmable gate array (FPGA), for example. The control circuit 214 is configured to analyze at least one physical property related to the signal channels 202(1)-202(N) to determine the maximum output power $P_{MAX}$ for the power amplifier circuit 208. In a non-limiting example, the physical property related to the signal channels 202(1)-202(N) can include a count of the signal channels 202(1)-202(N), a respective bandwidth of the signal channels 202(1)-202(N), a respective power of the signal channels 202(1)-202(N), and/or a respective waveform of the signal channels 202(1)-202(N). As discussed earlier, the signal channels 202(1)-202(N) may change (may be added or removed) dynamically based on service and capacity needs. As such, the control circuit 214 can be configured to dynamically analyze the physical property related to the signal channels 202(1)-202(N) to determine the maximum output power $P_{MAX}$ for the power amplifier circuit 208. The maximum output power $P_{MAX}$ of the power amplifier circuit 208 needs to be greater than or equal to the aggregated peak power $P_{OUT}$ of the output signal 206 ($P_{MAX} \geq P_{OUT}$) to be able to amplify the output signal 206 to the aggregated peak power $P_{OUT}$.

According to pervious discussions, power consumption of the power amplifier circuit 208 is dictated by the maximum output power $P_{MAX}$. As such, the control circuit 214 should select a smallest maximum output power $P_{MAX}$ required to amplify the input signal 204 to the aggregated peak power $P_{OUT}$, among many possible options. For example, if the aggregated peak power $P_{OUT}$ is 29 decibel-milliwatt (dBm), the control circuit 214 should choose the maximum output power $P_{MAX}$ higher than and as close to 29 dBm as possible. Upon determining the maximum output power $P_{MAX}$, the control circuit 214 configures the power amplifier circuit 208 according to the determined maximum output power $P_{MAX}$. As such, the power amplifier circuit 208 would not be configured to support power amplifying capabilities greater than what is actually needed. As a result, it may be possible to optimize power efficiency of the power amplifier circuit 208, thus helping to reduce power consumption of the power amplifier circuit 208.

The control circuit 214 may configure the power amplifier circuit 208 according to a process. In this regard, FIG. 3 is a flowchart of an exemplary process 300 that the power management circuit 200 of FIG. 2A can employ to configure the power amplifier circuit 208 to reduce power consumption.

Figure 3:
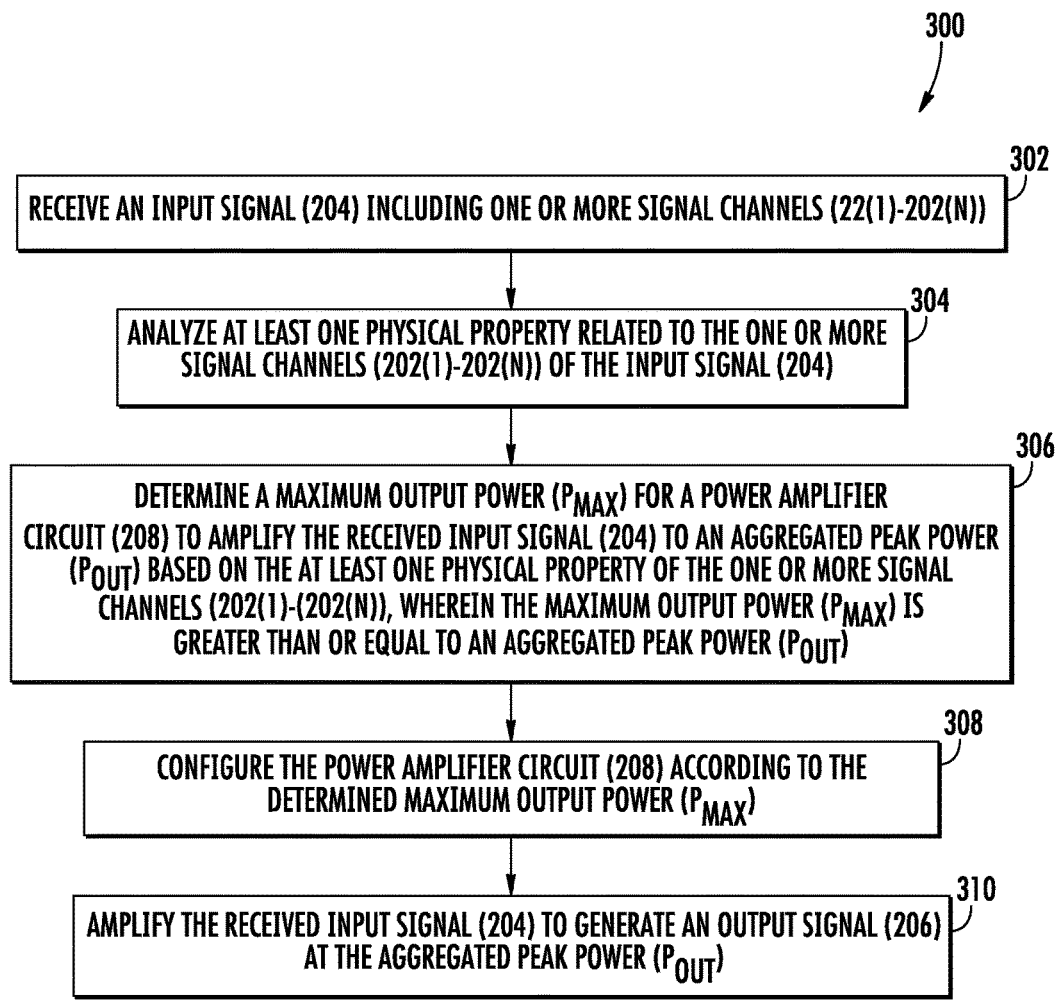
FIG. 3 is a flowchart of an exemplary process that the power management circuit of FIG. 2A can employ to configure a power amplifier circuit to reduce power consumption.

With reference to FIG. 3, the power management circuit 200 receives the input signal 204 that includes the signal channels 202(1)-202(N) (block 302). The control circuit 214 analyzes the physical property of the signal channels 202(1)-202(N) of the input signal 204 (block 304). The control circuit 214 determines the maximum output power $P_{MAX}$ for the power amplifier circuit 208 to amplify the received input signal 204 to the aggregated peak power $P_{OUT}$ based on the physical property of the signal channels 202(1)-202(N) (block 306). The control circuit 214 ensures that the maximum output power $P_{MAX}$ is greater than or equal to the aggregated peak power $P_{OUT}$ ($P_{MAX} \geq P_{OUT}$). The control circuit 214 then configures the power amplifier circuit 208 according to the determined maximum output power $P_{MAX}$ (block 308). The power amplifier circuit 208, in turn, amplifies the input signal 204 to generate the output signal 206 at the aggregated peak power $P_{OUT}$ (block 310).

With reference back to FIG. 2A, the control circuit 214 includes signal analysis circuitry 216 and power setting circuitry 218. In a non-limiting example, the signal analysis circuitry 216 and the power setting circuitry 218 may be separated or integrated into an integrated circuit (IC). The signal analysis circuitry 216 may be configured to analyze the physical property related to the signal channels 202(1)-202(N) and determine the maximum output power $P_{MAX}$ for the power amplifier circuit 208 to amplify the received input signal 204 to the aggregated peak power $P_{OUT}$ based on the physical property of the signal channels 202(1)-202(N). The signal analysis circuitry 216 may provide the determined maximum output power $P_{MAX}$ to the power setting circuitry 218 via a signal 220, and the power setting circuitry 218 may be configured to configure the power amplifier circuit 208 according to the determined maximum output power $P_{MAX}$.

In a non-limiting example, the signal analysis circuitry 216 may analyze the physical property of the input signal 204 by analyzing a sample 222 of the input signal 204. Accordingly, the signal analysis circuitry 216 may determine the count of the signal channels 202(1)-202(N), the respective bandwidth of the signal channels 202(1)-202(N), the respective power of the signal channels 202(1)-202(N), and/or the respective waveform of the signal channels 202(1)-202(N) based on the sample 222.

Figure 2B:
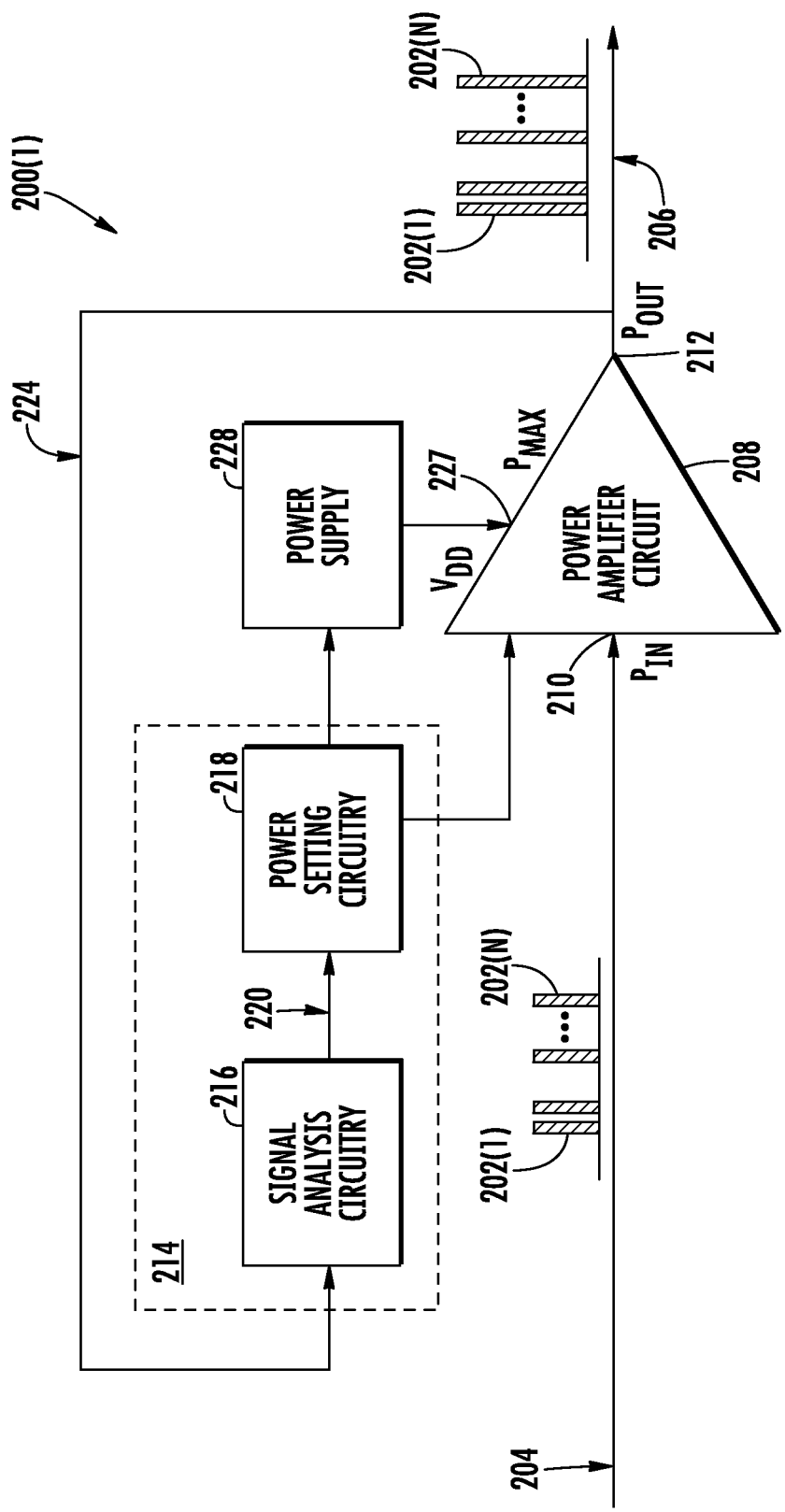
FIG. 2B is a schematic diagram of an exemplary power management circuit configured to analyze at least one physical property of one or more signal channels associated with an input signal to determine a maximum output power of an output signal by analyzing the output signal.

As an alternative to analyzing the sample 222 taken from the input signal 204, the signal analysis circuitry 216 may also analyze the output signal 206. In this regard, FIG. 2B is a schematic diagram of an exemplary power management circuit 200(1) configured to analyze the physical property of the signal channels 202(1)-202(N) associated with the input signal 204 to determine the maximum output power $P_{MAX}$ of the output signal 206 by analyzing the output signal 206. Common elements between FIGS. 2A and 2B are shown therein with common element numbers and will not be re-described herein.

With reference to FIG. 2B, the signal analysis circuitry 216 may determine the maximum output power $P_{MAX}$ of the power amplifier circuit 208 by analyzing a sample 224 of the output signal 206. Accordingly, the signal analysis circuitry 216 may determine the count of the signal channels 202(1)-202(N), the respective bandwidth of the signal channels 202(1)-202(N), the respective power of the signal channels 202(1)-202(N), and/or the respective waveform of the signal channels 202(1)-202(N) based on the sample 224. In a non-limiting example, the signal analysis circuitry 216 may analyze the sample 224 of the output signal 206 in conjunction with the sample 222 of the input signal 204.

Figure 2C:
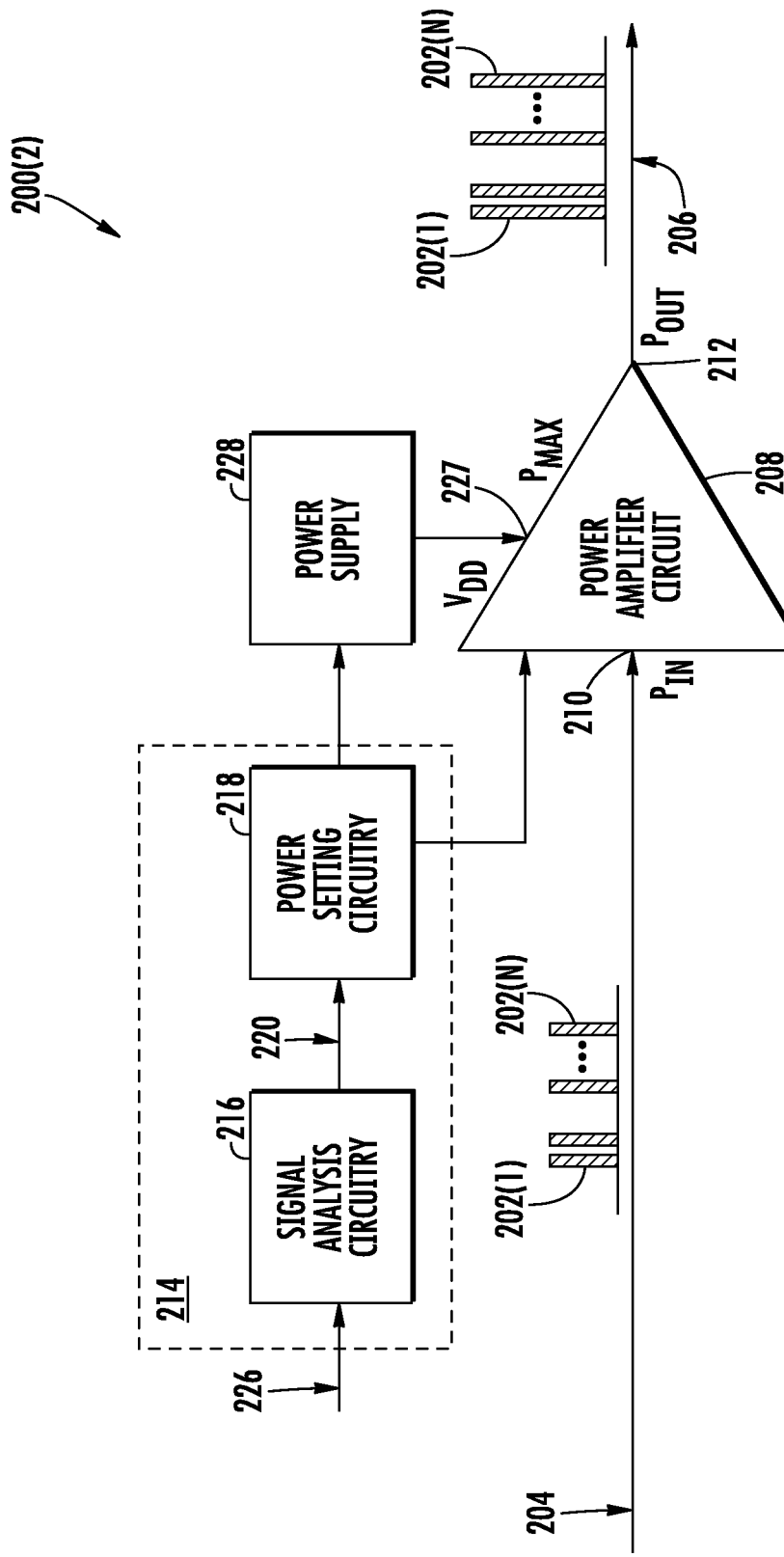
FIG. 2C is a schematic diagram of an exemplary power management circuit configured to analyze at least one physical property of one or more signal channels associated with an input signal to determine a maximum output power of an output signal by analyzing a digital representation of the input signal.

The signal analysis circuitry 216 may also be configured analyze the physical property of the input signal 204 based on digital means. In this regard, FIG. 2C is a schematic diagram of an exemplary power management circuit 200(2) configured to analyze the physical property of the signal channels 202(1)-202(N) associated with the input signal 204 to determine the maximum output power $P_{MAX}$ of the output signal 206 by analyzing a digital representation of the input signal 204. Common elements between FIGS. 2A and 2C are shown therein with common element numbers and will not be re-described herein.

With reference to FIG. 2C, the signal analysis circuitry 216 may be configured to analyze the physical property of the signal channels 202(1)-202(N) by analyzing a digital signal 226 that corresponds to the input signal 204. In a non-limiting example, the digital signal 226 is encoded in common public radio interface (CPRI) format. In addition to, or in conjunction with, analyzing the physical property of the signal channels 202(1)-202(N) based on the digital signal 226, the signal analysis circuitry 216 may also be configured to retrieve the physical property of the signal channels 202(1)-202(N) from a database.

With reference back to FIG. 2A, the power amplifier circuit 208 is configured to receive a bias voltage $V_{DD}$ at a voltage input 227 from a power supply 228 and amplify the received input signal 204 based on the bias voltage $V_{DD}$ to generate the output signal 206 at the aggregated peak power $P_{OUT}$. In a non-limiting example, the control circuit 214 can configure the power amplifier circuit 208 to operate in a saturated mode. In this regard, the aggregated peak power $P_{OUT}$ will be dependent on the bias voltage $V_{DD}$, as opposed to power amplifying gain of the power amplifier circuit 208. As such, the control circuit 214 can adjust the bias voltage $V_{DD}$ to cause the power amplifier circuit 208 to provide the determined maximum output power $P_{MAX}$ that is greater than or equal to the aggregated peak power $P_{OUT}$.

Figure 4:
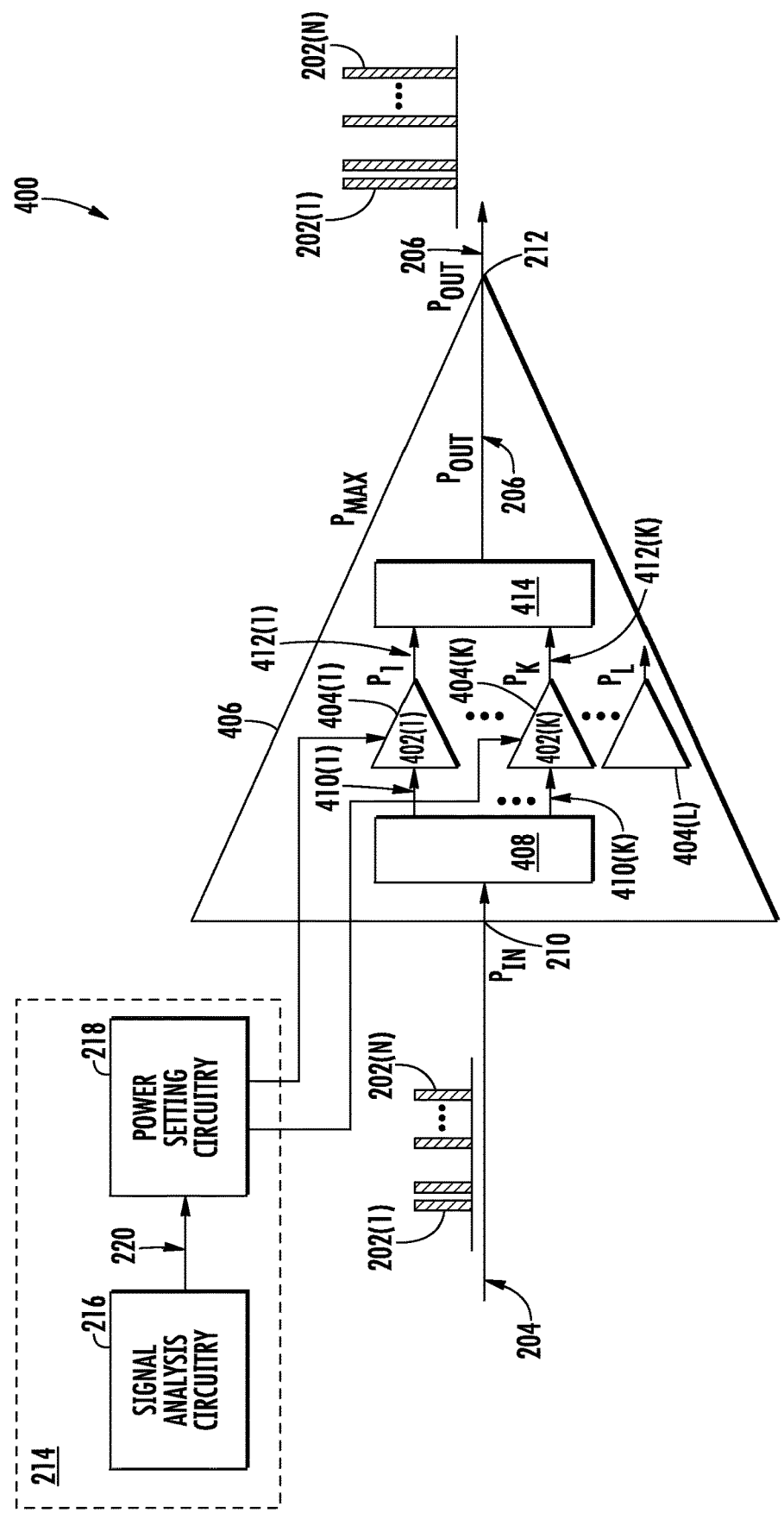
FIG. 4 is a schematic diagram of an exemplary power management circuit configured to enable one or more selected power amplifiers among a plurality of power amplifiers in a power amplifier circuit based on the maximum output power of FIGS. 2A-2C.

In another non-limiting example, the power amplifier circuit 208 may include multiple power amplifiers. Accordingly, the control circuit 214 may configure the power amplifier circuit 208 to provide the determined maximum output power $P_{MAX}$ by enabling an appropriate number of the multiple power amplifiers. In this regard, FIG. 4 is a schematic diagram of an exemplary power management circuit 400 configured to enable one or more selected power amplifiers 402(1)-402(K) among a plurality of power amplifiers 404(1)-404(L) in a power amplifier circuit 406 based on the maximum output power $P_{MAX}$ of FIGS. 2A-2C. Common elements between FIGS. 2A-2C and 4 are shown therein with common element numbers and will not be re-described herein.

With reference to FIG. 4, the power amplifiers 404(1)-404(L) are configured to provide a plurality of peak output powers $P_1$-$P_L$, respectively. The peak output powers $P_1$-$P_L$ may be the same or different. The control circuit 214 is configured to determine the maximum output power $P_{MAX}$ for the power amplifier circuit 406 by analyzing the physical property of the signal channels 202(1)-202(N). Based on the determined maximum output power $P_{MAX}$, the control circuit 214 can determine and enable the selected power amplifiers 402(1)-402(K) to provide the maximum output power $P_{MAX}$. For example, if the peak output powers $P_1$-$P_L$ are all equal to 0.25 watts (W) and the determined maximum output power $P_{MAX}$ is 0.7 W, the control circuit 214 would determine and enable three selected power amplifiers to provide a combined peak output power of 0.75 W (0.25 W×3=0.75 W), which is greater than or equal to the determined maximum output power $P_{MAX}$ of 0.7 W. To maximize power savings, the control circuit 214 would only enable a minimum set of the selected power amplifiers 402(1)-402(K) required to satisfy the determined maximum output power $P_{MAX}$. In the case of the above example, the control circuit 214 should not enable more than the three selected power amplifiers because the combined peak output power (0.75 W) of the three selected power amplifiers is sufficient to satisfy the determined maximum output power $P_{MAX}$ of 0.7 W.

The control circuit 214 may be further configured to disable power amplifiers of the power amplifiers 404(1)-404(L) that are not among the selected power amplifiers 402(1)-402(K). For example, after selecting the power amplifiers 404(1)-404(K) among the power amplifiers 404(1)-404(L) (L>K) as the selected power amplifiers 402(1)-402(K), the control circuit 214 may disable power amplifiers 404(K+1)-404(L).

The power amplifier circuit 406 may include a splitter 408 configured to receive and split the input signal 204 into one or more channel-based input signals 410(1)-410(K). Each of the channel-based input signals 410(1)-410(K) may correspond to at least one of the signal channels 202(1)-202(N) associated with the input signal 204. The splitter 408 provides the channel-based input signals 410(1)-410(K) to the selected power amplifiers 402(1)-402(K), respectively. The selected power amplifiers 402(1)-402(K) are configured to amplify the channel-based input signals 410(1)-410(K) to generate one or more channel-based output signals 412(1)-412(K), respectively. The power amplifier circuit 406 may further include a combiner 414 to combine the channel-based output signals 412(1)-412(K) to generate the output signal 206 at the aggregated peak power $P_{OUT}$.

Figure 5:
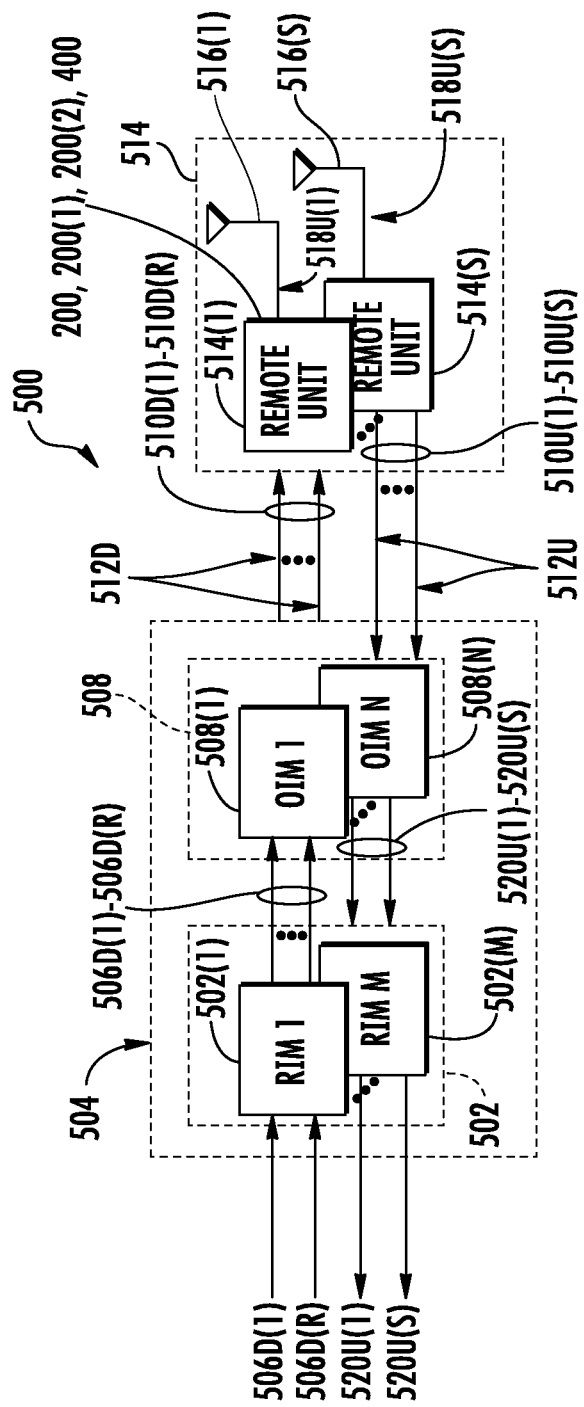
FIG. 5 is a schematic diagram an exemplary WDS provided in the form of an optical fiber-based WDS that can include a plurality of remote units that may employ the power management circuits of FIGS. 2A-2C and FIG. 4 to help reduce power consumption of the remote units.

FIG. 5 is a schematic diagram an exemplary WDS 500 provided in the form of an optical fiber-based WDS that can include a plurality of remote units that may employ the power management circuit 200 of FIG. 2A, the power management circuit 200(1) of FIG. 2B, the power management circuit 200(2) of FIG. 2C, and the power management circuit 400 of FIG. 4 to help reduce power consumption of the remote units. The WDS 500 includes an optical fiber for distributing communications services for multiple frequency bands. The WDS 500 in this example is comprised of three (3) main components. A plurality of radio interfaces provided in the form of radio interface modules (RIMs) 502(1)-502(M) are provided in a central unit 504 to receive and process a plurality of downlink communications signals 506D(1)-506D(R) prior to optical conversion into downlink optical fiber-based communications signals. The downlink communications signals 506D(1)-506D(R) may be received from a base station as an example. The RIMs 502(1)-502(M) provide both downlink and uplink interfaces for signal processing. The notations "1-R" and "1-M" indicate that any number of the referenced component, 1-R and 1-M, respectively, may be provided. The central unit 504 is configured to accept the RIMs 502(1)-502(M) as modular components that can easily be installed and removed or replaced in the central unit 504. In one example, the central unit 504 is configured to support up to twelve (12) RIMs 502(1)-502(12). Each of the RIMs 502(1)-502(M) can be designed to support a particular type of radio source or range of radio sources (i.e., frequencies) to provide flexibility in configuring the central unit 504 and the WDS 500 to support the desired radio sources.

For example, one RIM 502 may be configured to support the Personalized Communications System (PCS) radio band. Another RIM 502 may be configured to support the 800 megahertz (MHz) radio band. In this example, by inclusion of the RIMs 502(1)-502(M), the central unit 504 could be configured to support and distribute communications signals on both PCS and Long-Term Evolution (LTE) 700 radio bands, as an example. The RIMs 502(1)-502(M) may be provided in the central unit 504 that support any frequency bands desired, including, but not limited to, the US Cellular band, PCS band, Advanced Wireless Service (AWS) band, 700 MHz band, Global System for Mobile communications (GSM) 900, GSM 1800, and Universal Mobile Telecommunications System (UMTS). The RIMs 502(1)-502(M) may also be provided in the central unit 504 that support any wireless technologies desired, including but not limited to Code Division Multiple Access (CDMA), CDMA200, 1×RTT, Evolution-Data Only (EV-DO), UMTS, High-speed Packet Access (HSPA), GSM, General Packet Radio Services (GPRS), Enhanced Data GSM Environment (EDGE), Time Division Multiple Access (TDMA), LTE, iDEN, and Cellular Digital Packet Data (CDPD).

The RIMs 502(1)-502(M) may be provided in the central unit 504 that support any frequencies desired, including but not limited to US FCC and Industry Canada frequencies (824-849 MHz on uplink and 869-894 MHz on downlink), US FCC and Industry Canada frequencies (1850-1915 MHz on uplink and 1930-1995 MHz on downlink), US FCC and Industry Canada frequencies (1710-1755 MHz on uplink and 2110-2155 MHz on downlink), US FCC frequencies (698-716 MHz and 776-787 MHz on uplink and 728-746 MHz on downlink), EU R & TTE frequencies (880-915 MHz on uplink and 925-960 MHz on downlink), EU R & TTE frequencies (1710-1785 MHz on uplink and 1805-1880 MHz on downlink), EU R & TTE frequencies (1920-1980 MHz on uplink and 2110-2170 MHz on downlink), US FCC frequencies (806-824 MHz on uplink and 851-869 MHz on downlink), US FCC frequencies (896-901 MHz on uplink and 929-941 MHz on downlink), US FCC frequencies (793-805 MHz on uplink and 763-775 MHz on downlink), and US FCC frequencies (2495-2690 MHz on uplink and downlink).

With continuing reference to FIG. 5, the downlink communications signals 506D(1)-506D(R) are provided to a plurality of optical interfaces provided in the form of optical interface modules (OIMs) 508(1)-508(N) in this embodiment to convert the downlink communications signals 506D(1)-506D(R) into a plurality of downlink optical fiber-based communications signals 510D(1)-510D(R). The notation "1-N" indicates that any number of the referenced component 1-N may be provided. The OIMs 508(1)-508(N) may be configured to provide a plurality of optical interface components (OICs) that contain optical-to-electrical (O/E) and electrical-to-optical (E/O) converters, as will be described in more detail below. The OIMs 508(1)-508(N) support the radio bands that can be provided by the RIMs 502(1)-502(M), including the examples previously described above.

The OIMs 508(1)-508(N) each include E/O converters to convert the downlink communications signals 506D(1)-506D(R) into the downlink optical fiber-based communications signals 510D(1)-510D(R). The downlink optical fiber-based communications signals 510D(1)-510D(R) are communicated over a downlink optical fiber-based communications medium 512D to a plurality of remote units 514(1)-514(S). At least one selected remote unit among the remote units 514(1)-514(S), for example, remote unit 514(1), is configured to employ the power management circuit 200 of FIG. 2A, the power management circuit 200(1) of FIG. 2B, the power management circuit 200(2) of FIG. 2C, and the power management circuit 400 of FIG. 4 to help reduce power consumption in the selected the remote unit 514(1). The notation "1-S" indicates that any number of the referenced component 1-S may be provided. Remote unit O/E converters provided in the remote units 514(1)-514(S) convert the downlink optical fiber-based communications signals 510D(1)-510D(R) back into the downlink communications signals 506D(1)-506D(R), which are the converted into a plurality of downlink RF communications signals and provided to antennas 516(1)-516(S) in the remote units 514(1)-514(S) to client devices in the reception range of the antennas 516(1)-516(S). In this regard, the power amplifier circuit 208 in the power management circuit 200 of FIG. 2A, the power management circuit 200(1) of FIG. 2B, and the power management circuit 200(2) of FIG. 2C as well as the power amplifier circuit 406 in the power management circuit 400 of FIG. 4 are configured to receive the input signal 204 among the downlink RF communications signals. The power amplifier circuit 208 and the power amplifier circuit 406 amplify the input signal 204 to generate the output signal 206 for distribution among the downlink RF communications signals to the client devices via the antennas 516(1)-516(S).

The remote units 514(1)-514(S) receive a plurality of uplink RF communications signals from the client devices through the antennas 516(1)-516(S). The remote units 514(1)-514(S) convert the uplink RF communications signals into a plurality of uplink communications signals 518U(1)-518U(S). Remote unit E/O converters are also provided in the remote units 514(1)-514(S) to convert the uplink communications signals 518U(1)-518U(S) into a plurality of uplink optical fiber-based communications signals 510U(1)-510U(S). The remote units 514(1)-514(S) communicate the uplink optical fiber-based communications signals 510U(1)-510U(S) over an uplink optical fiber-based communications medium 512U to the OIMs 508(1)-508(N) in the central unit 504. The OIMs 508(1)-508(N) include O/E converters that convert the received uplink optical fiber-based communications signals 510U(1)-510U(S) into a plurality of uplink communications signals 520U(1)-520U(S), which are processed by the RIMs 502(1)-502(M) and provided as the uplink communications signals 520U(1)-520U(S). The central unit 504 may provide the uplink communications signals 520U(1)-520U(S) to a base station or other communications system.

Note that the downlink optical fiber-based communications medium 512D and the uplink optical fiber-based communications medium 512U connected to each of the remote units 514(1)-514(S) may be a common optical fiber-based communications medium, wherein for example, wave division multiplexing (WDM) is employed to provide the downlink optical fiber-based communications signals 510D(1)-510D(R) and the uplink optical fiber-based communications signals 510U(1)-510U(S) on the same optical fiber-based communications medium.

Figure 6:
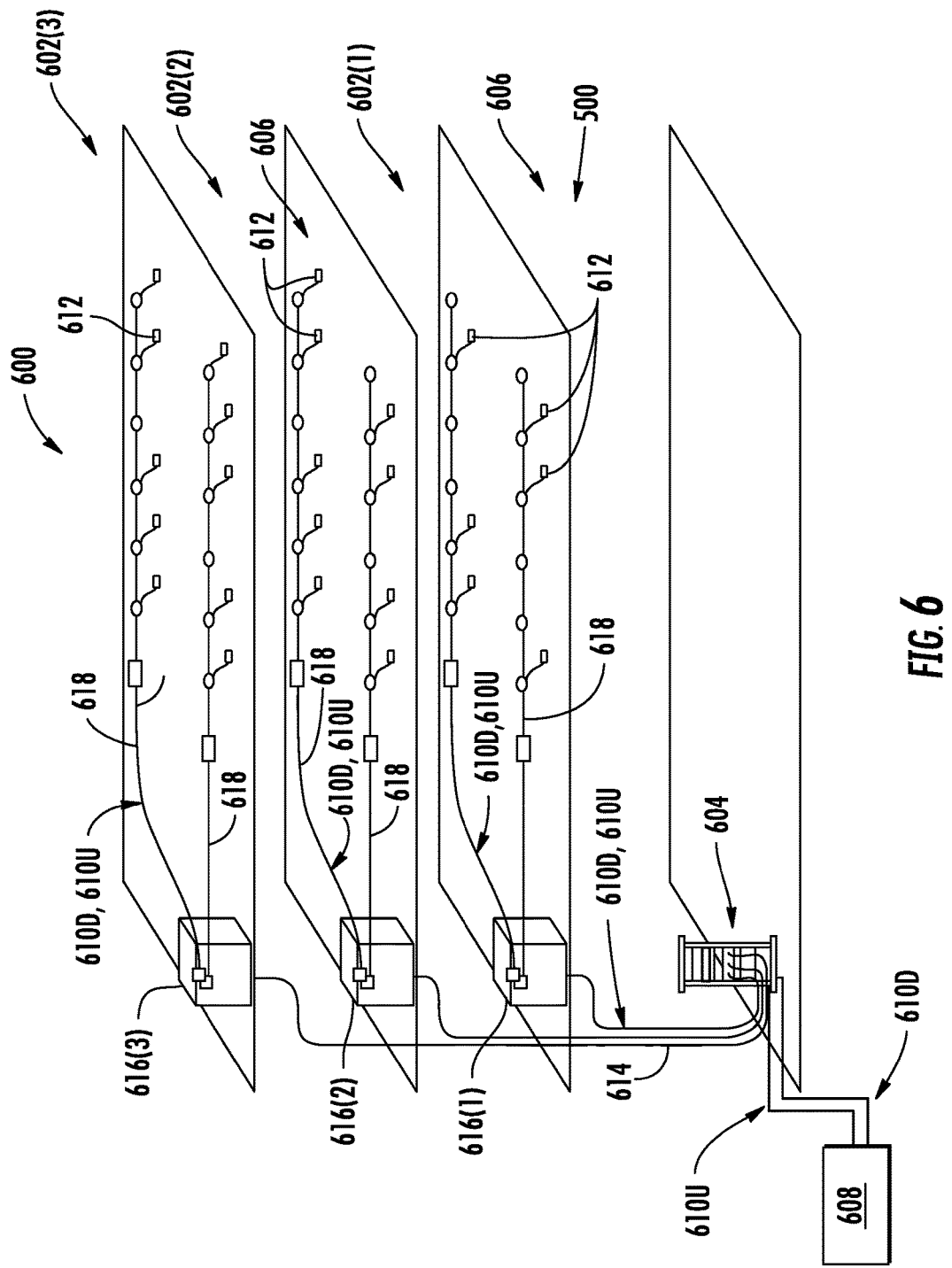
FIG. 6 is a partial schematic cut-away diagram of an exemplary building infrastructure in which a WDS, such as the WDS of FIG. 5, including one or more remote units that may employ the power management circuits of FIGS. 2A-2C and FIG. 4 to help reduce power consumption of the remote unit(s)

The WDS 500 of FIG. 5 may be provided in an indoor environment, as illustrated in FIG. 6. FIG. 6 is a partial schematic cut-away diagram of an exemplary building infrastructure 600 in which a WDS, such as the WDS 500 of FIG. 5, including one or more remote units that may employ the power management circuit 200 of FIG. 2A, the power management circuit 200(1) of FIG. 2B, the power management circuit 200(2) of FIG. 2C, and the power management circuit 400 of FIG. 4 to help reduce power consumption of the remote unit(s). The building infrastructure 600 in this embodiment includes a first (ground) floor 602(1), a second floor 602(2), and a third floor 602(3). The floors 602(1)-602(3) are serviced by a central unit 604 to provide antenna coverage areas 606 in the building infrastructure 600. The central unit 604 is communicatively coupled to a base station 608 to receive downlink communications signals 610D from the base station 608. The central unit 604 is communicatively coupled to a plurality of remote units 612 to distribute the downlink communications signals 610D to the remote units 612 and to receive uplink communications signals 610U from the remote units 612, as previously discussed above. The downlink communications signals 610D and the uplink communications signals 610U communicated between the central unit 604 and the remote units 612 are carried over a riser cable 614. The riser cable 614 may be routed through interconnect units (ICUs) 616(1)-616(3) dedicated to each of the floors 602(1)-602(3) that route the downlink communications signals 610D and the uplink communications signals 610U to the remote units 612 and also provide power to the remote units 612 via array cables 618.

Figure 7:
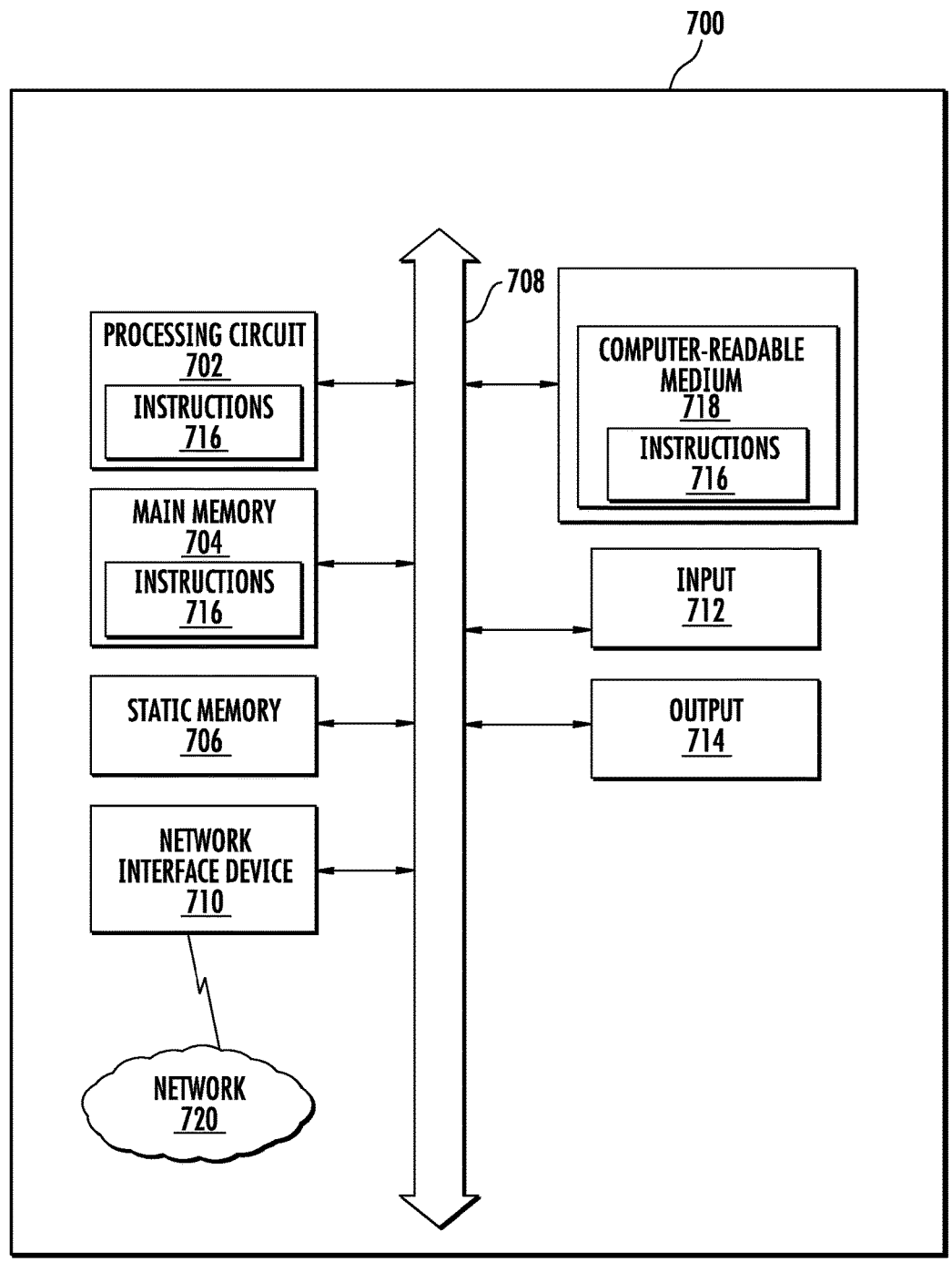
FIG. 7 is a schematic diagram representation of additional detail illustrating an exemplary computer system that could be employed in a controller, including a control circuit in the power management circuits of FIGS. 2A-2C and FIG. 4, for determining the maximum output power of the input signal.

FIG. 7 is a schematic diagram representation of additional detail illustrating an exemplary computer system 700 that could be employed in a controller, including the control circuit 214 in the power management circuit 200 of FIG. 2A, the power management circuit 200(1) of FIG. 2B, the power management circuit 200(2) of FIG. 2C, and the power management circuit 400 of FIG. 4, for determining the maximum output power $P_{MAX}$ of the input signal 204. In this regard, the computer system 700 is adapted to execute instructions from an exemplary computer-readable medium to perform these and/or any of the functions or processing described herein.

In this regard, the computer system 700 in FIG. 7 may include a set of instructions that may be executed to predict frequency interference to avoid or reduce interference in a multi-frequency distributed antenna system (DAS). The computer system 700 may be connected (e.g., networked) to other machines in a local area network (LAN), an intranet, an extranet, or the Internet. While only a single device is illustrated, the term "device" shall also be taken to include any collection of devices that individually or jointly execute a set (or multiple sets) of instructions to perform any one or more of the methodologies discussed herein. The computer system 700 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer.

The exemplary computer system 700 in this embodiment includes a processing circuit or processor 702, a main memory 704 (e.g., read-only memory (ROM), flash memory, dynamic random access memory (DRAM), such as synchronous DRAM (SDRAM), etc.), and a static memory 706 (e.g., flash memory, static random access memory (SRAM), etc.), which may communicate with each other via a data bus 708. Alternatively, the processor 702 may be connected to the main memory 704 and/or the static memory 706 directly or via some other connectivity means. The processor 702 may be a controller, and the main memory 704 or the static memory 706 may be any type of memory.

The processor 702 represents one or more general-purpose processing devices, such as a microprocessor, central processing unit, or the like. More particularly, the processor 702 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 702 is configured to execute processing logic in instructions for performing the operations and steps discussed herein.

The computer system 700 may further include a network interface device 710. The computer system 700 also may or may not include an input 712, configured to receive input and selections to be communicated to the computer system 700 when executing instructions. The computer system 700 also may or may not include an output 714, including, but not limited to, a display, a video display unit (e.g., a liquid crystal display (LCD) or a cathode ray tube (CRT)), an alphanumeric input device (e.g., a keyboard), and/or a cursor control device (e.g., a mouse).

The computer system 700 may or may not include a data storage device that includes instructions 716 stored in a computer-readable medium 718. The instructions 716 may also reside, completely or at least partially, within the main memory 704 and/or within the processor 702 during execution thereof by the computer system 700, the main memory 704 and the processor 702 also constituting a computer-readable medium. The instructions 716 may further be transmitted or received over a network 720 via the network interface device 710.

While the computer-readable medium 718 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A power management circuit, comprising:
a power amplifier circuit comprising a signal input and a signal output, the power amplifier circuit configured to:
  receive an input signal comprising one or more signal channels via the signal input;
  amplify the received input signal to generate an output signal at an aggregated peak power; and
  provide the output signal to the signal output; and
a control circuit configured to:
  analyze at least one physical property related to the one or more signal channels of the input signal;
  determine a maximum output power for the power amplifier circuit to amplify the received input signal to the aggregated peak power based on the at least one physical property of the one or more signal channels, wherein the maximum output power is greater than the aggregated peak power of the output signal; and
  configure the power amplifier circuit according to the determined maximum output power.

2. The power management circuit of claim 1, wherein the determined maximum output power of the power amplifier circuit is a smallest maximum output power required to amplify the received input signal to the aggregated peak power.

3. The power management circuit of claim 1, wherein the control circuit comprises:
signal analysis circuitry configured to:
  analyze the at least one physical property related to the one or more signal channels of the input signal; and
  determine the maximum output power for the power amplifier circuit to amplify the received input signal to the aggregated peak power based on the at least one physical property of the one or more signal channels; and
power setting circuitry configured to configure the power amplifier circuit according to the determined maximum output power.

4. The power management circuit of claim 3, wherein the at least one physical property related to the one or more signal channels comprises a count of the one or more signal channels, a respective bandwidth of the one or more signal channels, a respective power of the one or more signal channels, and a respective waveform of the one or more signal channels.

5. The power management circuit of claim 3, wherein the signal analysis circuitry is configured to analyze the at least one physical property of the one or more signal channels by analyzing a sample of the input signal.

6. The power management circuit of claim 3, wherein the signal analysis circuitry is configured to analyze the at least one physical property of the one or more signal channels by analyzing a sample of the output signal.

7. The power management circuit of claim 3, wherein the signal analysis circuitry is configured to analyze the at least one physical property of the one or more signal channels by analyzing a digital signal corresponding to the input signal.

8. The power management circuit of claim 7, wherein the digital signal is encoded in common public radio interface (CPRI) format.

9. The power management circuit of claim 3, wherein the signal analysis circuitry is further configured to retrieve the at least one physical property of the one or more signal channels from a database.

10. The power management circuit of claim 1, wherein:
the power amplifier circuit is further configured to:
  receive a bias voltage at a voltage input from a power supply; and
  amplify the received input signal based on the bias voltage to generate the output signal at the aggregated peak power; and
the control circuit is further configured to adjust the bias voltage to cause the power amplifier circuit to provide the determined maximum output power greater than or equal to the aggregated peak power of the output signal.

11. The power management circuit of claim 1, wherein:
the power amplifier circuit comprises a plurality of power amplifiers; and
the control circuit is further configured to determine and enable one or more selected power amplifiers among the plurality of power amplifiers based on the determined maximum output power.

12. The power management circuit of claim 11, further comprising:
a splitter configured to split the input signal into one or more channel-based input signals and provide the one or more channel-based input signals to the one or more selected power amplifiers, wherein the one or more selected power amplifiers are configured to amplify the one or more channel-based input signals to generate one or more channel-based output signals, respectively; and
a combiner configured to receive and combine the one or more channel-based output signals to generate the output signal at the aggregated peak power.

13. The power management circuit of claim 11, wherein the control circuit is further configured to disable power amplifiers of the plurality of power amplifiers that are not among the one or more selected power amplifiers.

14. A method for configuring a power amplifier circuit in a remote unit in a wireless distribution system (WDS), comprising:
receiving an input signal comprising one or more signal channels;
analyzing at least one physical property related to the one or more signal channels of the input signal;
determining a maximum output power for a power amplifier circuit to amplify the received input signal to an aggregated peak power based on the at least one physical property of the one or more signal channels, wherein the maximum output power is greater than the aggregated peak power;
configuring the power amplifier circuit according to the determined maximum output power; and
amplifying the received input signal to generate an output signal at the aggregated peak power.

15. The method of claim 14, further comprising determining the maximum output power of the power amplifier circuit as a smallest maximum output power required to amplify the received input signal to the aggregated peak power.

16. The method of claim 14, further comprising analyzing the at least one physical property of the one or more signal channels by analyzing a sample of the input signal.

17. The method of claim 14, further comprising analyzing the at least one physical property of the one or more signal channels by analyzing a sample of the output signal.

18. The method of claim 14, further comprising analyzing the at least one physical property of the one or more signal channels by analyzing a digital signal corresponding to the input signal.

19. The method of claim 14, further comprising retrieving the at least one physical property of the one or more signal channels from a database.

20. The method of claim 14, further comprising adjusting a bias voltage received by the power amplifier circuit to provide the determined maximum output power greater than or equal to the aggregated peak power of the output signal.

21. The method of claim 14, further comprising determining and enabling one or more selected power amplifiers among a plurality of power amplifiers based on the determined maximum output power.

22. The method of claim 21, further comprising:
splitting the input signal into one or more channel-based input signals and providing the one or more channel-based input signals to the one or more selected power amplifiers;
amplifying the one or more channel-based input signals to generate one or more channel-based output signals, respectively; and
combining the one or more channel-based output signals to generate the output signal at the aggregated peak power.

23. The method of claim 21, further comprising disabling, power amplifiers of the plurality of power amplifiers that are not among the one or more selected power amplifiers.

24. A wireless distribution system (WDS), comprising:
a plurality of remote units configured to:
receive and convert a plurality of downlink communications signals into a plurality of downlink radio frequency (RF) communications signals for distribution to client devices; and
receive a plurality of uplink RF communications signals from the client devices and convert the plurality of uplink RF communications signals into a plurality of uplink communications signals; and
a central unit configured to:
distribute the plurality of downlink communications signals to the plurality of remote units; and
receive the plurality of uplink communications signals from the plurality of remote units;
wherein at least one selected remote unit among the plurality of remote units comprises a power management circuit, the power management circuit comprises:
a power amplifier circuit comprising a signal input and a signal output, the power amplifier circuit configured to:
receive an input signal among the plurality of downlink RF communications signals, the input signal comprising one or more signal channels via the signal input;
amplify the received input signal to generate an output signal at an aggregated peak power; and
provide the output signal to the signal output for distribution among the plurality of downlink RF communications signals to the client devices; and
a control circuit configured to:
analyze at least one physical property related to the one or more signal channels of the input signal;
determine a maximum output power for the power amplifier circuit to amplify the received input signal to the aggregated peak power based on the at least one physical property of the one or more signal channels, wherein the maximum output power is greater than the aggregated peak power of the output signal; and
configure the power amplifier circuit according to the determined maximum output power.

* * * * *